United States Patent [19]
Okada et al.

[11] Patent Number: 5,217,761
[45] Date of Patent: Jun. 8, 1993

[54] SHEET PLASMA CVD APPARATUS

[75] Inventors: Ken Okada, Takatsuki; Junnosuke Daimon, Nara, both of Japan

[73] Assignee: Chugai Ro Co., Ltd., Osaka, Japan

[21] Appl. No.: 812,035

[22] Filed: Dec. 23, 1991

[30] Foreign Application Priority Data

Dec. 25, 1990 [JP] Japan .................. 2-405698

[51] Int. Cl.⁵ .................. C23C 16/48; C23C 16/50
[52] U.S. Cl. .................. 427/579; 427/569; 118/715; 118/723
[58] Field of Search ............ 118/715, 723; 427/569, 427/579

[56] References Cited

U.S. PATENT DOCUMENTS

| 4,131,659 | 12/1978 | Authier | 264/25 |
| 4,509,451 | 4/1985 | Collins | 118/723 |
| 4,581,248 | 4/1986 | Roche | 118/725 |
| 4,838,201 | 6/1989 | Fraas | 118/715 |

FOREIGN PATENT DOCUMENTS

| 60-189928 | 9/1985 | Japan | 118/715 |
| 62-152122 | 7/1987 | Japan | 118/718 |
| 1-252781 | 10/1989 | Japan | |
| 0197803 | 3/1978 | U.S.S.R. | |

Primary Examiner—Richard Bueker

[57] ABSTRACT

A sheet plasma CVD apparatus for forming a film by generating sheet plasma in parallel with a substrate comprising a gas supply nozzle in opposition to the substrate with the sheet plasma sandwiched therebetween. A source gas supply opening is formed in the center of the gas supply nozzle. A plurality of reaction gas supply openings are formed in the periphery of the source gas supply opening, the source jetted out from the source gas supply opening and the reaction jetted out from the reaction gas supply openings. The source and reaction gases intersect with each other in the sheet plasma.

14 Claims, 3 Drawing Sheets

SHEET PLASMA CVD APPARATUS

BACKGROUND OF THE INVENTION

Field of the Invention

The present invention relates to a sheet plasma CVD apparatus for forming a film on the surface of a substrate.

Description of the Related Arts

As disclosed, for example, in Japanese Patent Laid-Open Publication No. 1-252781, according to a conventional sheet plasma CVD apparatus, a pressure gradient type plasma gun and an anode section are provided in opposition to each other in a processing chamber connected with an air discharge device; source gas introducing openings are provided between intermediate electrodes and in the anode section; and a reaction gas introducing opening is provided on the side wall of the processing chamber.

According to the conventional sheet plasma CVD apparatus, in forming a film on a substrate provided in the processing chamber, discharge gas, for example, Ar gas is introduced into the plasma gun with a discharge device discharging air in the processing chamber and a DC voltage is applied to the space between the plasma gun and the anode section to generate sheet plasma. Source gas, for example, $SiH_4$ and reaction gas, for example, $O_2$ are supplied from the source gas introducing openings and the reaction gas introducing opening, respectively into the processing chamber. The source gas existing in the vicinity of the source gas introducing openings is diffused earlier than that existing far therefrom while it is reacting sequentially. As a result, a film is formed on the surface of the substrate. Excessive gas is discharged from the discharge opening.

However, according to the conventional sheet plasma CVD, since the substrate is provided in parallel with the sheet plasma and the source gas is supplied to both ends of the sheet plasma, namely, from the plasma gun section and the anode section, the concentration of the source gas existing distant from the source gas introducing openings becomes lower than that existing in the vicinity thereof. As a result, supposing that the source gas is $SiH_4$ and the reaction gas is $O_2$, a film containing much Si is formed on the substrate in the vicinity of the source gas introducing openings and a film containing much $O_2$ is formed on the substrate distant from the source gas introducing openings. Thus, a film containing components uniformly dispersed therein is not formed on the surface of the substrate.

In addition, since the source gas is introduced into the processing chamber in parallel with the film forming surface of the substrate, film forming efficiency is low.

SUMMARY OF THE INVENTION

It is therefore an object of the present invention to provide a sheet plasma CVD apparatus capable of efficiently forming a film, containing components uniformly, on a substrate.

In accomplishing these and other object, there is provided a sheet plasma CVD apparatus for forming a film by generating sheet plasma in parallel with a substrate comprising: a gas supply nozzle in opposition to the substrate with the sheet plasma sandwiched therebetween; a source gas supply opening formed in the center of the gas supply nozzle; a plurality of reaction gas supply openings formed in the periphery of the source gas supply opening. In the above construction, the source gas jetted out from the source gas supply opening and the reaction gas jetted out from the reaction gas supply openings intersect with each other in the sheet plasma.

According to the above-described construction, source gas jetted out from the source gas supply opening of a plurality of the source gas supply nozzles and reaction gas jetted out from the reaction gas supply opening collide each other in the plasma section and mix each other and are excited. Then, mixed gas keep moving toward the substrate to form a film on the surface of the substrate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will become apparent from the following description taken in conjunction with the preferred embodiments thereof with reference to the accompanying drawings which are given by way of illustration only, and thus are not limitative of the present invention, and in which.

DETAILED DESCRIPTION OF THE INVENTION

Figure 1:
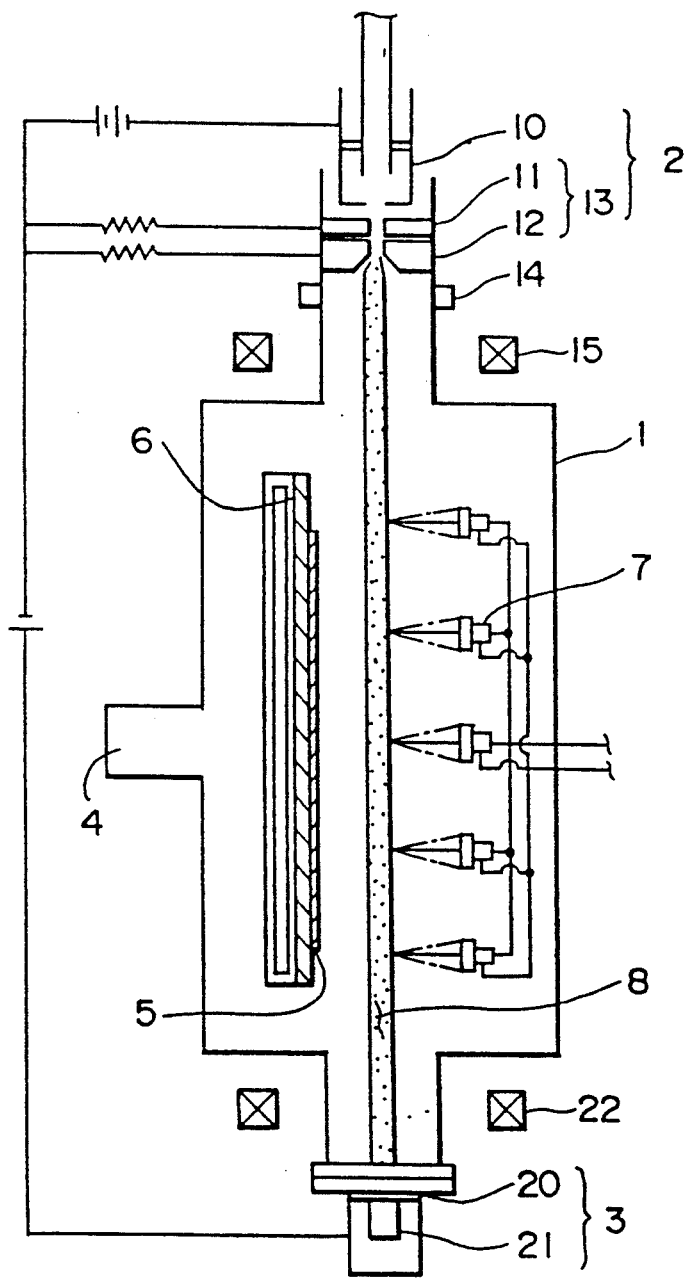
FIG. 1 is a schematic illustration of a sheet plasma CVD apparatus in accordance with the present invention.

Before the description of the present invention proceeds, it is to be noted that like parts are designated by like reference numerals throughout the accompanying drawings.

An embodiment of the present invention will be described below with reference to the accompanied drawings.

Referring to FIG. 1, a sheet plasma CVD apparatus in accordance with the present invention comprises a pressure gradient type plasma gun 2 provided above a processing chamber 1; an anode section 3 positioned below the processing chamber 1 and opposed to the plasma gun 2; a vacuum pump (not shown) for making the processing chamber 1 vacuum through a discharge opening 4 provided in the center of a side wall of the processing chamber 1; a pallet 6 for mounting thereon a substrate 5 provided along the side wall, of the processing chamber 1, on the discharge opening 4 side; and gas supply nozzles 7 provided vertically at five positions and opposed to the pallet 6.

The plasma gun 2 comprises a hollow discharge cathode 10 and an intermediate electrode 13 composed of a circular ferrite permanent magnet 11 and a magnetic coil 12. Discharge gas, for example, Ar gas is introduced into the plasma gun 2. There are provided below the plasma gun 2 permanent magnets 14 for stretching or contracting a cylindrical plasma into a sheet plasma 8 having a desired width, thickness, and density and a magnetic coil 15 for preventing the sheet plasma 8 from expanding.

The anode section 3 comprises an anode 20 and a fucusing permanent magnet 21 provided in the rear of the anode 20. A magnetic coil 22 is positioned above the anode section 3. The magnetic coil 22 prevents the sheet plasma 8 from expanding so as to converge it on the anode 20.

Figure 2:
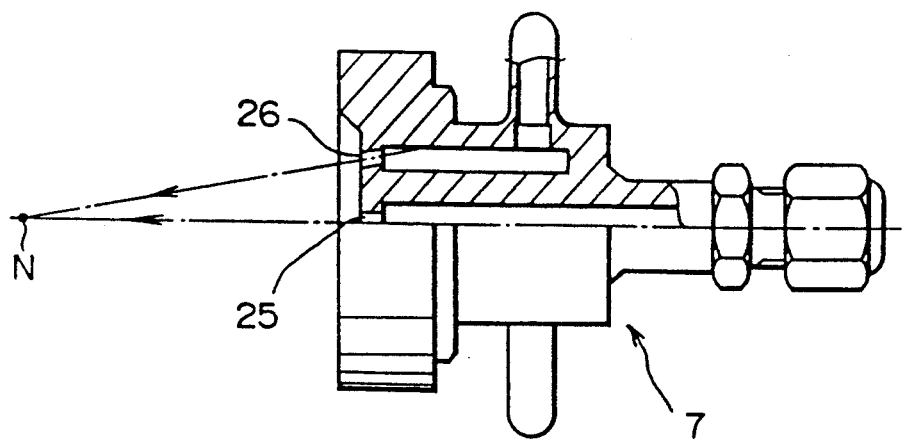
FIG. 2 is a side elevation partly in section of a gas supply nozzle.
Figure 3:
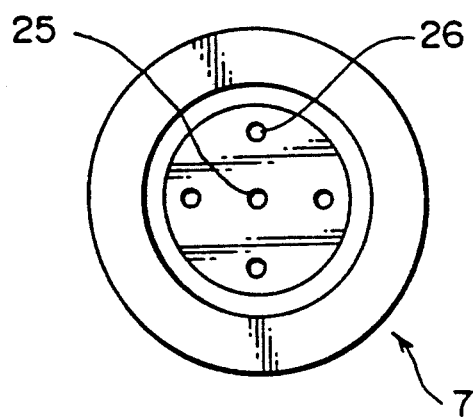
FIG. 3 is a front view showing the gas supply nozzle.

As shown in FIGS. 2 and 3, the gas supply nozzle 7 has a gas supply opening 25 in the center thereof and reaction gas supply openings 26 provided at four positions in the periphery of the gas supply opening 25.

The source gas, for example, $S_iH_4$ supplied by the source gas supply opening 25 is jetted along the extension of the center line of the source gas supply opening 25. Reaction gas, for example, $O_2$ supplied from the reaction gas supply openings 26 is jetted toward the intersection (N) of the center line of the source gas supply opening 25 and the sheet plasma 8. The source gas and the reaction gas collide with other in the sheet plasma 8 and are mixed with each other, and the mix gas is excited.

The source gas supply opening 25 and the reaction gas supply openings 26 are connected in parallel with each other, respectively between gas supply nozzles 7.

According to the sheet plasma CVD apparatus, the substrate 5 is mounted on the pallet 6 provided in the processing chamber 1. Discharge gas, for example, Ar gas is introduced into the plasma gun 2 with the vacuum pump discharging air in the processing chamber 1. A DC voltage is applied between the plasma gun 2 and the anode 20 to generate the sheet plasma 8. Then, the source gas and the reaction gas are jetted from the source gas supply opening 25 and the reaction gas supply openings 26 of the gas supply nozzle 7, respectively. Since the source gas supply opening 25 and reaction gas supply openings 26 are arranged as described above, the source gas and the reaction gas intersect with each other in the sheet plasma 8 and are mixed with each other. The mix gas is excited. As a result, the source gas and the reaction gas keep moving toward the substrate 5 to form a film of, for example, $S_iO_2$ on the surface of the substrate 5.

Figure 4:
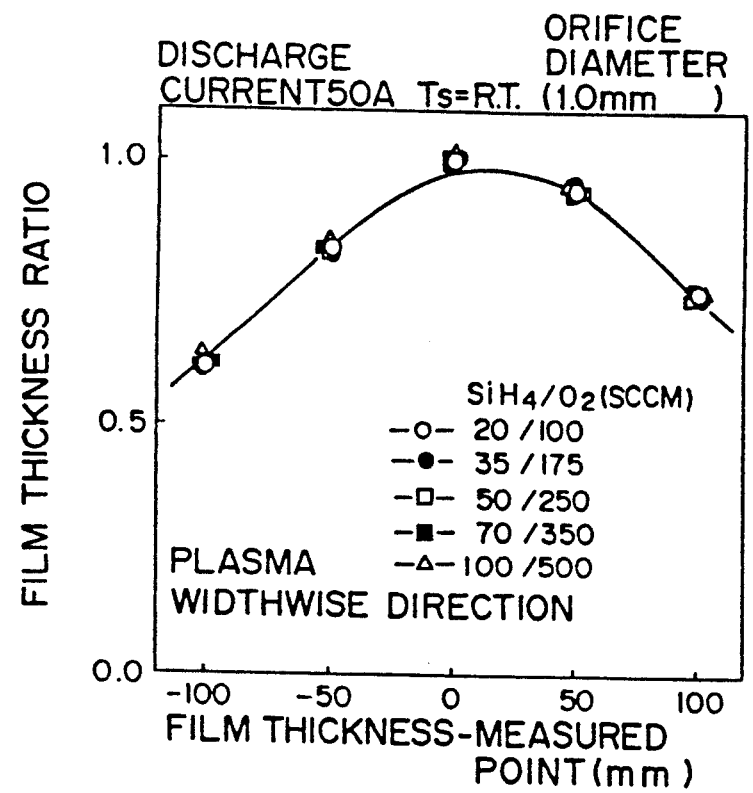
FIG. 4 is a graph showing the thickness distribution of a film formed on a substrate in the widthwise direction.
Figure 5:
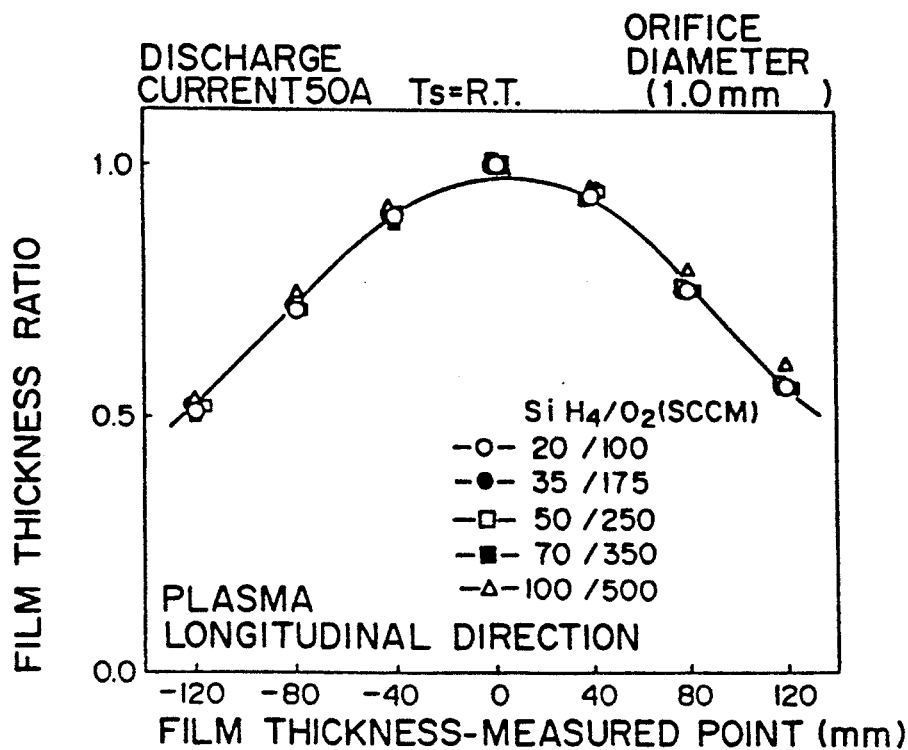
FIG. 5 is a graph showing the thickness distribution of a film formed on a substrate in the longitudinal direction.

FIGS. 4 and 5 show the result of measurements conducted by changing the flow rate of jetted gas (source gas : reaction gas = 1 : 5) in order to examine the thickness distribution of films formed by means of one gas supply nozzle 7. FIG. 4 shows the thickness distribution of films in the widthwise direction of the substrate 5. FIG. 5 shows the thickness distribution of films in the longitudinal direction of the substrate 5. As apparent from FIGS. 4 and 5, the thickness distributions of the films are almost the same irrespective of the flow rate of the gas. The film thickness is approximated by the following equation:

$$T = A \cdot exp(-B(X-C)^2)$$

where T is film thickness; A, B, C are constants; and X is the distance between the intersection of the film forming surface of the substrate 5 and the center line of the gas supply nozzle 7.

A desired film thickness distribution is determined based on the above equation when a plurality of the gas supply nozzles 7 is provided in the processing chamber 1.

Although a plurality of the gas supply nozzles 7 is provided in this embodiment, however, one gas supply nozzle 7 may be employed depending on the size of the substrate 5.

As apparent from the foregoing description, in the sheet plasma CVD apparatus in accordance with the present invention, the gas supply nozzles are provided in opposition to the sheet plasma with the substrate sandwiched therebetween, and the source gas and the reaction gas are jetted out to intersect both gases with each other. Therefore, both gases are mixed with each other favorably and excited. Thus, a film containing components uniformly on the substrate can be formed. In addition, since the substrate is perpendicular to the direction in which both gases are jetted out, the film can be formed efficiently.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A sheet plasma CVD apparatus for forming a film by generating sheet plasma generally in parallel with a substrate comprising:

a gas supply nozzle in opposition to said substrate with said sheet plasma sandwiched therebetween;

source gas supply means for supplying a source gas at least to the sheet plasma, the source gas supply means comprising a source gas supply opening formed generally in the center of said gas supply nozzle; and reaction gas supply means for supplying a reaction gas to a point in the sheet plasma where the source gas is supplied by the source gas supply means, the reaction gas supply means comprising a plurality of reaction gas supply openings formed around a periphery of said source gas supply opening, wherein said source gas jetted out from said source gas supply opening and said reaction gas jetted out from said reaction gas supply openings intersect with each other of said sheet plasma.

2. The sheet plasma CVD apparatus as recited in claim 1, wherein the gas supply nozzle has a longitudinal axis generally intersecting the center thereof, the source gas supply means supplies the source gas from the gas supply nozzle along a source gas supply axis, and the longitudinal axis of the gas supply nozzle is generally parallel to the source gas supply axis.

3. The sheet plasma CVD apparatus as recited in claim 2, wherein each of the reaction gas supply openings have a reaction gas supply axis along which the reaction gas supply is supplied, the reaction gas supply axes being non-perpendicular and non-parallel to the source gas supply axis, each of the reaction gas supply axes intersecting the source gas supply axis generally at the point in the sheet plasma such that the source gas and reaction gas collide with each other in the sheet plasma and are mixed with one another.

4. The sheet plasma CVD apparatus as recited in claim 3, wherein a plurality of gas supply nozzles are provided each having a source gas supply opening and a plurality of reaction gas supply openings, a separate intersection point for source gas and reaction gas being provided in the sheet plasma for each of the plurality of gas supply nozzles.

5. The sheet plasma CVD apparatus as recited in claim 1, wherein a plurality of gas supply nozzles are provided each having a source gas supply opening and a plurality of reaction gas supply openings, a separate intersection point for source gas and reaction gas being provided in the sheet plasma for each of the plurality of gas supply nozzles.

6. The sheet plasma CVD apparatus as recited in claim 1, wherein the plurality of reaction gas supply openings are angled with respect to the gas supply opening such that reaction gas exiting the gas supply nozzle will collide with the source gas at the point in the sheet plasma so that the reaction gas and source gas are mixed with one another.

7. The sheet plasma CVD apparatus as recited in claim 1, wherein the source gas is $S_iH_4$ and the reaction gas is $O_2$ and wherein the substrate has a film formed thereon by the source gas and the reaction gas, the film being made of $S_iO_2$.

8. A method for forming a film with a sheet plasma CVD apparatus comprising the steps of:
providing a substrate;
generating a sheet plasma generally in parallel to the substrate;
supplying a source gas from a gas supply nozzle to the sheet plasma;
supplying a reaction gas from the gas supply nozzle to the sheet plasma;
colliding the source gas and the reaction gas at a point in the sheet plasma to mix the source gas and reaction gas, the source gas and reaction gas otherwise being unmixed before reaching the point in the sheet plasma as the source gas and reaction gas travel from the gas supply nozzle to the sheet plasma;
exciting the mixed source gas and reaction gas in the sheet plasma when the source gas and reaction gas collide;
moving the mixed source gas and reaction gas toward the substrate as a result of exciting the mixed gases; and
forming a film on a surface of the substrate with the mixed gases.

9. The method as recited in claim 8, further comprising the step of supplying plural streams of reaction gas from the gas supply nozzle during the step of supplying the reaction gas, the plural streams being emitted from the gas supply nozzle at positions displaced from a position where the source gas is emitted from the gas supply nozzle, the plural streams of reaction gas all generally first colliding with the source gas at the point in the sheet plasma.

10. The method as recited in claim 9, wherein the step of supplying plural streams further comprises the step of providing a plurality of reaction gas supply openings in the gas supply nozzle around an opening in the gas supply nozzle for the source gas, the step of supplying the source gas further comprises supplying the source gas along a source gas supply axis and the step of supplying a reaction gas further comprises supplying each of the plural streams of reaction gas along a reaction gas supply axis, the reaction gas supply axes being non-perpendicular and non-parallel to the source gas supply axis, each of the reaction gas supply axes intersecting the source gas supply axis generally at the point in the sheet plasma such that the source gas and reaction gas are unmixed before said point in the sheet plasma.

11. The method as recited in claim 10, further comprising the step of providing a plurality of gas supply nozzles which each supply source gas and plurality streams of reaction gas, a separate intersection point for source gas and reaction gas being provided in the sheet plasma for each of the plurality of gas supply nozzles.

12. The method as recited in claim 8, further comprising the step of providing a plurality of gas supply nozzles which each supply source gas and reaction gas, a separate intersection point for source gas and reaction gas being provided in the sheet plasma for each of the plurality of gas supply nozzles.

13. The method as recited in claim 8, wherein the step of supplying reaction gas supplies reaction gas from the gas supply nozzle at an angle with respect to source gas supplied from the gas supply nozzle so that the source gas and reaction gas collide at the point in the sheet plasma.

14. The method as recited in claim 8, further comprising the step of using $S_iH_4$ as the source gas and the step of using $O_2$ as the reaction gas and wherein the step of forming a film forms on $S_iO_2$ film on the substrate.

* * * * *